US012631592B2

(12) United States Patent
Reznicek et al.

(10) Patent No.: US 12,631,592 B2
(45) Date of Patent: May 19, 2026

(54) BIOMARKER SENSING STRUCTURE

(71) Applicant: International Business Machines Corporation, Armonk, NY (US)

(72) Inventors: Alexander Reznicek, Troy, NY (US); Bahman Hekmatshoartabari, White Plains, NY (US); Martin G. Keen, Cary, NC (US); Jeremy R. Fox, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 18/510,783

(22) Filed: Nov. 16, 2023

(65) Prior Publication Data

US 2025/0164441 A1 May 22, 2025

(51) Int. Cl.
*G01N 27/414* (2006.01)
*H10D 84/63* (2025.01)
*H10P 50/26* (2026.01)

(52) U.S. Cl.
CPC ..... *G01N 27/4148* (2013.01); *G01N 27/4145* (2013.01); *H10D 84/63* (2025.01); *H10P 50/268* (2026.01)

(58) Field of Classification Search
CPC .... H10D 84/83; H10D 84/63; H10D 84/0114; H10D 84/0119; H10D 84/67; H10D 10/40; H10D 10/051; G01N 27/4145; G01N 27/4148; G01N 27/414; G01N 33/48707; G01N 27/226; B01L 3/502715
See application file for complete search history.

(56) References Cited

U.S. PATENT DOCUMENTS

| | | | |
|---|---|---|---|
| 7,091,788 B2 | 8/2006 | Glass et al. | |
| 8,062,491 B1 | 11/2011 | Gau | |
| 9,377,543 B2 | 6/2016 | Cai et al. | |
| 9,478,537 B2 | 10/2016 | Zhang et al. | |
| 10,209,215 B2 | 2/2019 | Eklund et al. | |
| 2016/0370313 A1* | 12/2016 | Aparin | G01N 21/27 |
| 2016/0379975 A1* | 12/2016 | Cai | H10D 10/061 |
| | | | 438/48 |
| 2017/0227556 A1* | 8/2017 | Feller | G01N 27/4145 |
| 2017/0263656 A1* | 9/2017 | Gordon | H10F 30/29 |
| 2019/0207011 A1* | 7/2019 | Reznicek | A61B 5/00 |
| 2020/0103332 A1* | 4/2020 | Shin | G01N 27/4145 |

(Continued)

FOREIGN PATENT DOCUMENTS

WO 2012075445 A2 6/2012

OTHER PUBLICATIONS

Akkilic et al., "Single-molecule biosensors: Recent advances and applications," Biosensors and Biolectronics 151, 2020, pp. 1-19.

(Continued)

*Primary Examiner* — Alia Sabur
(74) *Attorney, Agent, or Firm* — CANTOR COLBURN LLP; Kelsey M. Skodje

(57) ABSTRACT

A biosensor device is provided. The biosensor includes an amplifying bipolar junction transistor (BJT) and a sensing BJT defining a sensing trench. The sensing BJT and the amplifying BJT are coupled to form a Sziklai pair with an emitter of the sensing BJT connected to a collector of the amplifying BJT and a collector of the sensing BJT connected to a base of the amplifying BJT.

22 Claims, 6 Drawing Sheets

(56) References Cited

U.S. PATENT DOCUMENTS

2020/0295165 A1*   9/2020   Jain ...................... H10D 10/821
2020/0363393 A1*   11/2020   Reznicek ......... G01N 33/48707

OTHER PUBLICATIONS

Anonymous, "Darlington Transistors," URL: https://www.electronics-tutorials.ws/transistor/darlington-transistor.html; Retrieved: Oct. 27, 2023; 8 pages.

Besteman et al., "Enzyme-Coated Carbon Nanotubes as Single-Molecule Biosensors," Nano Letters, vol. 3, No. 6, 2003, 4 pages.

Espinosa et al., "Molecular Recognition by Silicon Nanowire Field-Effect Transistor and Single-Molecule Force Spectroscopy," Micromachines, 2022, 11 pages.

Guo et al., "Rapid single-molecule detection of COVID-19 and MERS antigens via nanobody-functionalized organic electrochemical transistors," Nature Biomedical Engineering, vol. 5, Jul. 2021, pp. 666-677.

Macchia et al., "Large-Area Interfaces for Single-Molecule Label-free Bioelectronic Detection," Chemical Reviews, No. 122, 2022, pp. 4636-4699.

Macchia et al., "Single-molecule detection with a millimetre-sized transistor," Nature Communications, 2018, pp. 1-10.

Sarcina et al., "A large area organic transistor with 3D printed sensing gate for noninvasive single molecule detection of pancreatic mucinous cyst markers," Analytical and Bioanalytical Chemistry, 2022, pp. 5657-5669.

Shkodra et al., "Electrolyte-gated carbon nanotube field-effect transistor-based biosensors: Principles and applications," Appl. Phys. Rev. 8, 041325, Dec. 2021, pp. 1-28.

Shukla et al., "A New Circuit Model of Small-Signal Sziklai Pair," International Journal of Applied Physics and Mathematics, vol. 3, No. 4, Jul. 2013, pp. 231-236.

Yau et al., "Substrate-Voltage Modulation of Currents in Symmetric SOI Lateral Bipolar Transistors," IEEE Transactions on Electron Devices, vol. 63, No. 5, May 2016, pp. 1835-1839.

* cited by examiner

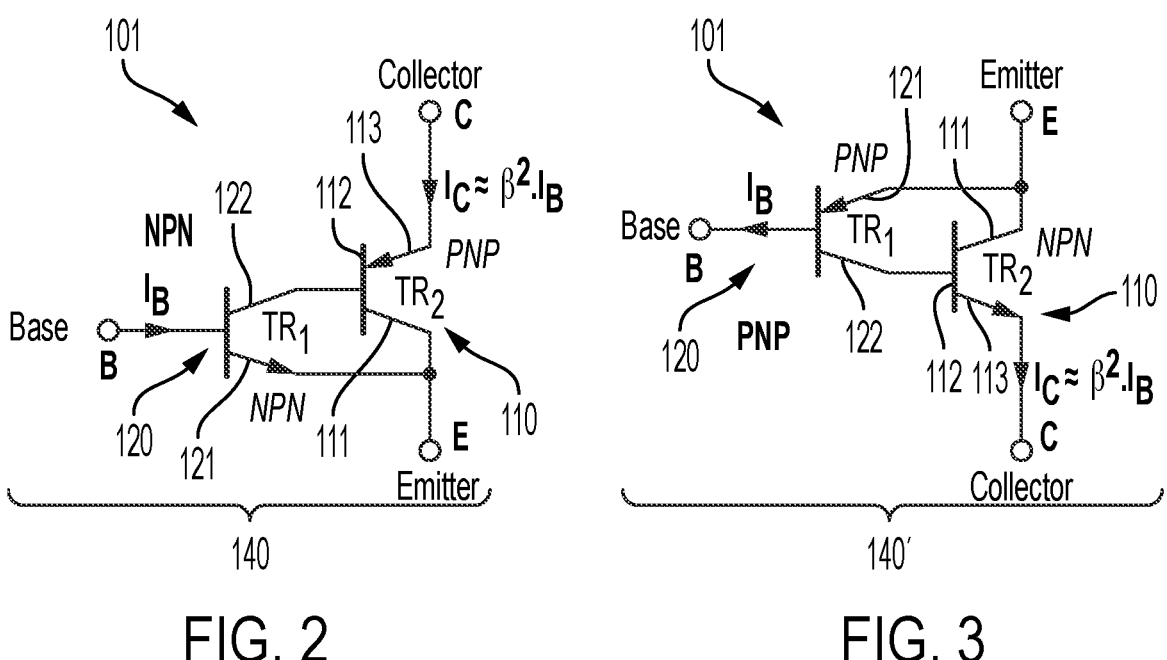
FIG. 2
FIG. 3
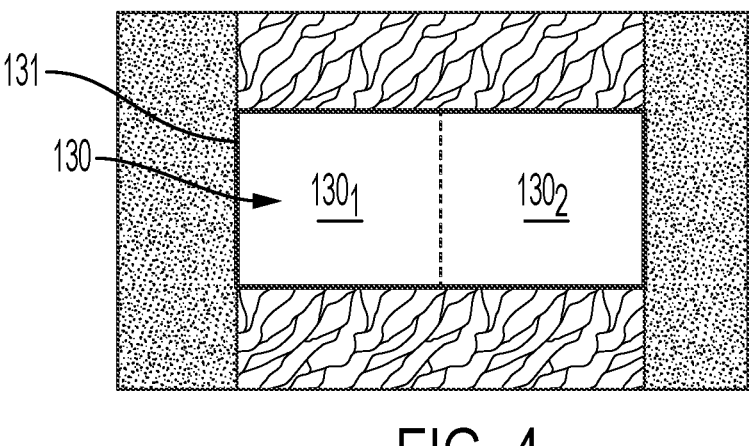
FIG. 4

500

| | |
|---|---|
| Block 501 | Forming amplifying BJT |
| Block 502 | Forming sensing BJT |
| Block 503 | Coupling sensing BJT and amplifying BJT to form Sziklai pair |
| Block 504 | Etching sacrificial layer such that sensing BJT defines sensing trench |

BIOMARKER SENSING STRUCTURE

BACKGROUND

The present invention generally relates to fabrication methods and resulting structures for semiconductor devices. More specifically, the present invention relates to a semiconductor device with a highly sensitive biomarker sensing structure.

A biosensor is an analytical device that can be used for the detection of a chemical substance. Biosensors typically include a biological component with a physicochemical detector. The biological element is a biologically derived material or biomimetic component that interacts with, binds with or recognizes the analyte under study. A transducer or detector element transforms one signal into another one and operates in a physicochemical manner resulting from the interaction of the analyte with the biological element.

SUMMARY

According to an aspect of the disclosure, a biosensor device is provided. The biosensor includes an amplifying bipolar junction transistor (BJT) and a sensing BJT defining a sensing trench. The sensing BJT and the amplifying BJT are coupled to form a Sziklai pair with an emitter of the sensing BJT connected to a collector of the amplifying BJT and a collector of the sensing BJT connected to a base of the amplifying BJT.

According to an aspect of the disclosure, a biosensor device is provided. The biosensor device includes an amplifying bipolar junction transistor (BJT) arranged as a NPN transistor and a sensing BJT defining a sensing trench and being arranged as a PNP transistor. The sensing BJT and the amplifying BJT are coupled to form a Sziklai pair characterized in that an emitter of the sensing BJT is connected to a collector of the amplifying BJT to serve as an emitter for the Sziklai pair, a collector of the sensing BJT is connected to a base of the amplifying BJT and an emitter of the amplifying BJT serves as a collector for the Sziklai pair. In additional or alternative embodiments, an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

According to an aspect of the disclosure, a biosensor device is provided. The biosensor device includes an amplifying bipolar junction transistor (BJT) arranged as an PNP transistor and a sensing BJT defining a sensing trench and being arranged as a NPN transistor. The sensing BJT and the amplifying BJT are coupled to form a Sziklai pair characterized in that a collector of the sensing BJT is connected to a base of the amplifying BJT, an emitter of the amplifying BJT serves as a collector for the Sziklai pair and an emitter of the sensing BJT is connected to a collector of the amplifying BJT to serve as an emitter for the Sziklai pair. In additional or alternative embodiments, an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

According to an aspect of the disclosure, a method of assembling a biosensor device is provided. The method includes forming an amplifying bipolar junction transistor (BJT) as a lateral transistor, forming a sensing BJT, which includes a sacrificial layer interposed between lower and upper intrinsic bases, as a vertical transistor on the amplifying BJT, coupling the sensing BJT and the amplifying BJT to form a Sziklai pair and etching the sacrificial layer such that the sensing BJT defines a sensing trench. In additional or alternative embodiments, the method is thus compatible with advanced complementary-metal-oxide-semiconductor (CMOS) technology nodes and provides for a biosensor device in which an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

According to an aspect of the disclosure, a method of assembling a biosensor device is provided and includes forming an amplifying bipolar junction transistor (BJT) as a lateral transistor, forming a sensing BJT, which includes a sacrificial layer interposed between lower and upper intrinsic bases, as a vertical transistor on the amplifying BJT, coupling the sensing BJT and the amplifying BJT to form one of a Sziklai pair with an NPN-PNP arrangement and a Sziklai pair with a PNP-NPN arrangement and etching the sacrificial layer such that the sensing BJT defines a sensing trench. In additional or alternative embodiments, the method is thus compatible with advanced complementary-metal-oxide-semiconductor (CMOS) technology nodes and provides for a biosensor device in which an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2 is a schematic circuit diagram of the biosensor device of FIG. 1 in accordance with one or more embodiments of the present invention;

FIG. 3 is a alternate schematic circuit diagram of the biosensor device of FIG. 1 in accordance with one or more embodiments of the present invention;

FIG. 4 is an enlarged view of a sensing trench of the biosensor device of FIG. 1 in accordance with one or more embodiments of the present invention;

Figure 1:
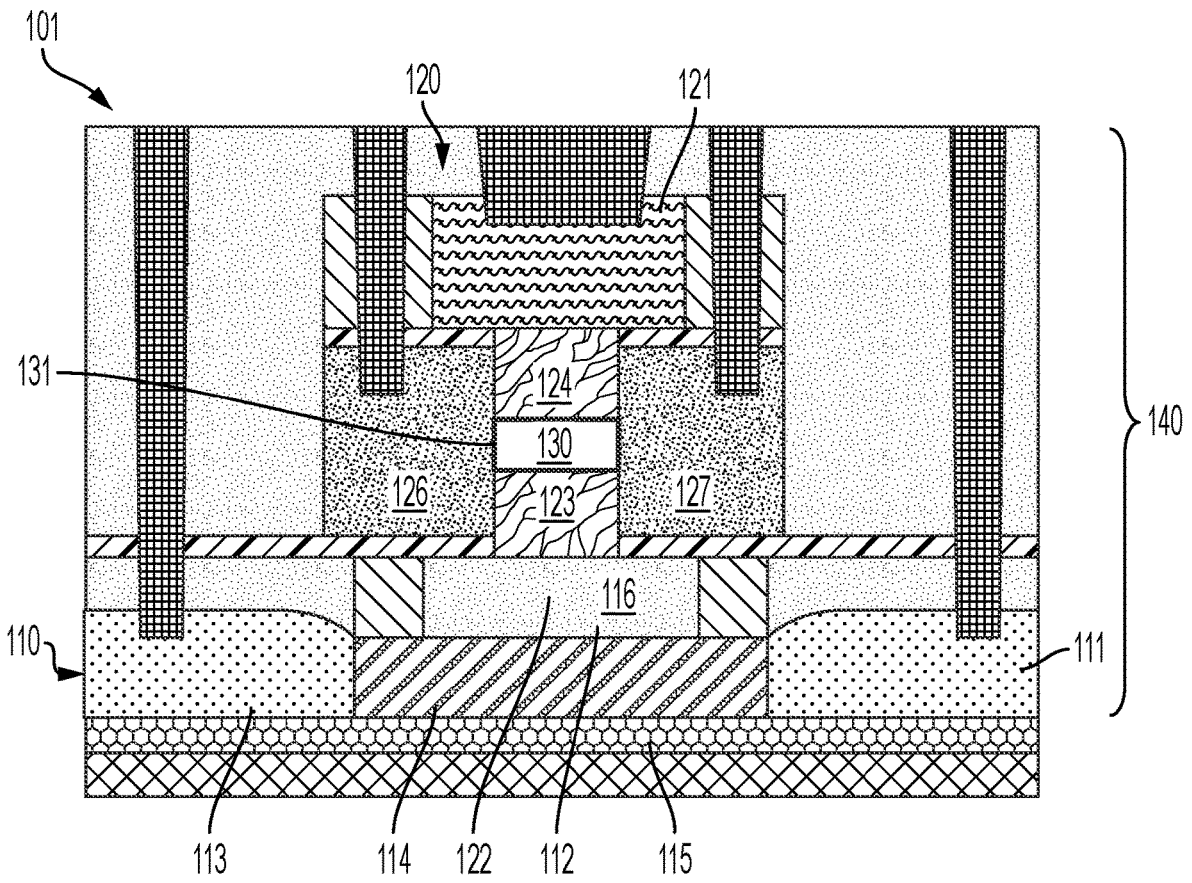
FIG. 1 is a side schematic view of a biosensor device in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

According to an aspect of the disclosure, a biosensor device is provided. The biosensor includes an amplifying bipolar junction transistor (BJT) and a sensing BJT defining a sensing trench. The sensing BJT and the amplifying BJT are coupled to form a Sziklai pair with an emitter of the sensing BJT connected to a collector of the amplifying BJT and a collector of the sensing BJT connected to a base of the amplifying BJT. In additional or alternative embodiments, an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

In accordance with one or more additional or alternative embodiments, the Sziklai pair is a complementary Darlington pair. The biosensor device is thus compatible with advanced complementary-metal-oxide-semiconductor (CMOS) technology nodes.

In accordance with one or more additional or alternative embodiments, the sensing BJT is a PNP transistor and the amplifying BJT is an NPN transistor. The biosensor device is thus compatible with advanced complementary-metal-oxide-semiconductor (CMOS) technology nodes.

In accordance with one or more additional or alternative embodiments, the sensing BJT is a vertical transistor, the amplifying BJT is a lateral transistor and the sensing BJT is integrated vertically on the amplifying BJT. The sensing BJT and the amplifying BJT are therefore highly-sensitive and tightly-integrated.

In accordance with one or more additional or alternative embodiments, the lateral transistor includes an emitter, the collector of the amplifying BJT, an epitaxial intrinsic base interposed between the emitter and the collector of the amplifying BJT and an epitaxial extrinsic base disposed as the base of the amplifying BJT on the epitaxial intrinsic base, the vertical transistor comprises a lower epitaxial intrinsic base disposed on the epitaxial extrinsic base and an upper epitaxial intrinsic base with the sensing trench defined between the lower and upper epitaxial intrinsic bases, and the vertical transistor further includes extrinsic bases in contact with opposite ends of the lower and upper epitaxial intrinsic bases and the sensing trench. The sensing BJT and the amplifying BJT are therefore highly-sensitive and tightly-integrated.

In accordance with one or more additional or alternative embodiments, a dielectric layer lines the sensing trench. The sensing BJT is therefore operative whereby an analyte has a gating effect on the base of the sensing BJT.

In accordance with one or more additional or alternative embodiments, dimensions of the sensing trench are set according to a size of a biomolecule being sensed. The biosensor device can therefore be configured for operations relating to various types of analytes.

In accordance with one or more additional or alternative embodiments, a height of the sensing trench can be about 0.3 nm for DNA sensing, about 5-10 nm for small protein sensing, about 40 nm for enzyme or exosome sensing, about 100 nm for large protein sensing and about 5000 nm for cancer cell sensing. The biosensor device can therefore be configured for operations relating to DNA sensing, small protein sensing, enzyme or exosome sensing and/or cancel cell sensing.

In accordance with one or more additional or alternative embodiments, the sensing trench is bifurcated one or more times. The biosensor device can therefore sense more than one molecule at a time.

According to an aspect of the disclosure, a biosensor device is provided. The biosensor device includes an amplifying bipolar junction transistor (BJT) arranged as a NPN transistor and a sensing BJT defining a sensing trench and being arranged as a PNP transistor. The sensing BJT and the amplifying BJT are coupled to form a Sziklai pair characterized in that an emitter of the sensing BJT is connected to a collector of the amplifying BJT to serve as an emitter for the Sziklai pair, a collector of the sensing BJT is connected to a base of the amplifying BJT and an emitter of the amplifying BJT serves as a collector for the Sziklai pair. In additional or alternative embodiments, an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

In accordance with one or more additional or alternative embodiments, the Sziklai pair is a complementary Darlington pair. The biosensor is thus compatible with advanced complementary-metal-oxide-semiconductor (CMOS) technology nodes.

In accordance with one or more additional or alternative embodiments, the sensing BJT is a vertical transistor, the amplifying BJT is a lateral transistor and the sensing BJT is integrated vertically on the amplifying BJT. The biosensor device is thus compatible with advanced complementary-metal-oxide-semiconductor (CMOS) technology nodes.

In accordance with one or more additional or alternative embodiments, a dielectric layer lines the sensing trench. The sensing BJT is therefore operative whereby an analyte has a gating effect on the base of the sensing BJT.

In accordance with one or more additional or alternative embodiments, dimensions of the sensing trench are set according to a size of a biomolecule being sensed. The biosensor device can therefore be configured for operations relating to various types of analytes.

In accordance with one or more additional or alternative embodiments, a height of the sensing trench can be about 0.3 nm for DNA sensing, about 5-10 nm for small protein sensing, about 40 nm for enzyme or exosome sensing, about 100 nm for large protein sensing and about 5000 nm for cancer cell sensing. The biosensor device can therefore be configured for operations relating to DNA sensing, small protein sensing, enzyme or exosome sensing and/or cancel cell sensing.

In accordance with one or more additional or alternative embodiments, the sensing trench is bifurcated one or more times. The biosensor device can therefore sense more than one molecule at a time.

According to an aspect of the disclosure, a biosensor device is provided. The biosensor device includes an amplifying bipolar junction transistor (BJT) arranged as an PNP transistor and a sensing BJT defining a sensing trench and being arranged as a NPN transistor. The sensing BJT and the amplifying BJT are coupled to form a Sziklai pair characterized in that a collector of the sensing BJT is connected to a base of the amplifying BJT, an emitter of the amplifying BJT serves as a collector for the Sziklai pair and an emitter of the sensing BJT is connected to a collector of the amplifying BJT to serve as an emitter for the Sziklai pair. In additional or alternative embodiments, an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

In accordance with one or more additional or alternative embodiments, the Sziklai pair is a complementary Darlington pair. The biosensor is thus compatible with advanced complementary-metal-oxide-semiconductor (CMOS) technology nodes.

In accordance with one or more additional or alternative embodiments, the sensing BJT is a vertical transistor, the amplifying BJT is a lateral transistor and the sensing BJT is integrated vertically on the amplifying BJT. The biosensor device is thus compatible with advanced complementary-metal-oxide-semiconductor (CMOS) technology nodes.

In accordance with one or more additional or alternative embodiments, a dielectric layer lines the sensing trench. The sensing BJT is therefore operative whereby an analyte has a gating effect on the base of the sensing BJT.

In accordance with one or more additional or alternative embodiments, dimensions of the sensing trench are set according to a size of a biomolecule being sensed. The biosensor device can therefore be configured for operations relating to various types of analytes.

In accordance with one or more additional or alternative embodiments, a height of the sensing trench can be about 0.3 nm for DNA sensing, about 5-10 nm for small protein sensing, about 40 nm for enzyme or exosome sensing, about 100 nm for large protein sensing and about 5000 nm for cancer cell sensing. The biosensor device can therefore be configured for operations relating to DNA sensing, small protein sensing, enzyme or exosome sensing and/or cancel cell sensing.

In accordance with one or more additional or alternative embodiments, the sensing trench is bifurcated one or more times. The biosensor device can therefore sense more than one molecule at a time.

According to an aspect of the disclosure, a method of assembling a biosensor device is provided. The method includes forming an amplifying bipolar junction transistor (BJT) as a lateral transistor, forming a sensing BJT, which includes a sacrificial layer interposed between lower and upper intrinsic bases, as a vertical transistor on the amplifying BJT, coupling the sensing BJT and the amplifying BJT to form a Sziklai pair and etching the sacrificial layer such that the sensing BJT defines a sensing trench. In additional or alternative embodiments, the method is thus compatible with advanced complementary-metal-oxide-semiconductor (CMOS) technology nodes and provides for a biosensor device in which an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

According to an aspect of the disclosure, a method of assembling a biosensor device is provided and includes forming an amplifying bipolar junction transistor (BJT) as a lateral transistor, forming a sensing BJT, which includes a sacrificial layer interposed between lower and upper intrinsic bases, as a vertical transistor on the amplifying BJT, coupling the sensing BJT and the amplifying BJT to form one of a Sziklai pair with an NPN-PNP arrangement and a Sziklai pair with a PNP-NPN arrangement and etching the sacrificial layer such that the sensing BJT defines a sensing trench. In additional or alternative embodiments, the method is thus compatible with advanced complementary-metal-oxide-semiconductor (CMOS) technology nodes and provides for a biosensor device in which an analyte has a gating effect on the base of the sensing BJT, changing the base current and therefore the collector and emitter currents of the sensing BJT, and the sensing BJT has an intrinsic gain associated with a BJT current gain which is further amplified by the current gain of the amplifying BJT, creating a very high effective gain.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, single-molecule biosensors are of interest for real-time detection of individual biological molecules with high specificity and accuracy, uncovering unique properties of individual molecules which are hidden when measured using ensemble averaging methods. Measuring a signal generated by an individual molecule or its interaction with biological partners is not only crucial for early diagnosis of various diseases, such as cancer, and to follow medical treatments but also offers a great potential for future point-of-care devices and personalized medicine.

Most efforts in this area have been focused on emerging materials-based technologies, such as carbon nanotubes and organic transistors. Carbon nanotubes have been widely studied for single-molecule biosensors. However, despite their potential, they are not ready for widespread manufacturing. Organic transistors have also been studied but tend to be incompatible with standard complementary-metal-oxide-semiconductor (CMOS) manufacturing. Silicon nanowires have also been studied for single-molecule detection. However, silicon nanowires have not yet been adopted in advanced CMOS technology nodes.

Accordingly, there remains a need for biosensor structures and methods which are compatible with standard IC manufacturing and with advanced CMOS technologies in particular.

Turning now to an overview of the aspects of the invention, one or more embodiments of the invention address the above-described shortcomings of the prior art by providing a biosensor device that includes an amplifying bipolar junction transistor (BJT) and a sensing BJT defining a sensing trench. The sensing BJT and the amplifying BJT are coupled to form a Sziklai pair with, for example, an emitter of the sensing BJT connected to a collector of the amplifying BJT and a collector of the sensing BJT connected to a base of the amplifying BJT.

The above-described aspects of the invention address the shortcomings of the prior art by providing a highly-sensitive and tightly-integrated biosensor that includes complementary Darlington pair (Sziklai) BJTs in which a vertical bio-sensitive BJT defines a sample trench within its intrinsic base and is integrated vertically on a lateral BJT. The biosensor and its fabrication methods are compatible with advanced CMOS technology nodes.

Turning now to a more detailed description of aspects of the present invention, FIG. 1 depicts a biosensor device 101. The biosensor device 101 includes an amplifying BJT 110 and a sensing BJT 120, which is formed to define a sensing trench 130. In accordance with embodiments, the sensing BJT 120 and the amplifying BJT 110 are electrically coupled with one another to form a Sziklai pair 140 (i.e., a complementary Darlington pair) in which the amplifying BJT 110 is arranged as a lateral NPN transistor and the sensing BJT 120 is arranged as a vertical PNP transistor that is vertically integrated on the amplifying BJT 110. The Sziklai pair 140 is characterized in that an emitter 121 of the sensing BJT 120 is connected to a collector 111 of the amplifying BJT 110 forming an emitter of the Sziklai pair 140 and a collector 122 of the sensing BJT 120 is connected to a base 112 of the amplifying BJT 110. An emitter 113 (see below) of the amplifying BJT 110 serves as a collector of the Sziklai pair 140.

As shown in FIG. 1, the amplifying BJT 110 arranged as the lateral transistor includes an emitter 113, the collector 111 of the amplifying BJT, an epitaxial intrinsic base 114 disposed on a substrate 115 and interposed between the emitter 113 and the collector 111 of the amplifying BJT 110 and an epitaxial extrinsic base 116 disposed as the base 112 of the amplifying BJT 110 on the epitaxial intrinsic base 114. Also as shown, the sensing BJT 120 arranged as the vertical transistor includes a lower epitaxial intrinsic base 123, an upper epitaxial intrinsic base 124 and extrinsic bases 126, 127. The lower epitaxial intrinsic base 123 is disposed on the epitaxial extrinsic base 116 of the amplifying BJT 110. The sensing trench 130 is defined between the lower epitaxial intrinsic base 123 and the upper epitaxial intrinsic base 124. The extrinsic base 116 of the amplifying BJT 110 also serves as the collector 122 of the sensing BJT 120. The extrinsic bases 126, 127 are disposed in contact with opposite ends of the lower epitaxial intrinsic base 123, the upper epitaxial intrinsic base 124 and the sensing trench 130. In some cases, a dielectric layer 131 can be provided to line sidewalls of the sensing trench 130.

In accordance with further embodiments, dimensions of the sensing trench 130 can be set according to a size of a biomolecule that is being sensed. As examples, a height of the sensing trench 130 can be about 0.3 nm for DNA sensing, about 5-10 nm for small protein sensing, about 40 nm for enzyme or exosome sensing, about 100 nm for large protein sensing and about 5000 nm for cancer cell sensing.

With continued reference to FIG. 1 and with additional reference to FIG. 2, the collector current of TR1 is equal to the base current of TR2 and therefore an overall gain of the pair of the amplifying BJT 110 and the sensing BJT 120 is approximately the product of the gains of the amplifying BJT 110 and the sensing BJT 120 as shown in the following equations.

$$I_{C1} \approx \beta_1 I_{B1}, \ I_{C2} \approx \beta_2 I_{B2}, \ I_{B2} = I_{C1} \text{ therefore } I_{C2} \approx \beta_1 \beta_2 I_{B1}$$

$$\text{Since } I_B = I_{B1}, \ I_C = I_{E2} \approx I_{C2}, \text{ assuming } \beta_1 = \beta_2 = \beta \text{ we have } I_C \approx \beta^2 I_B$$

Since it is known that the base of a BJT can be gated to modulate BJT current flow, it follows that an analyte (e.g., a single molecule or bio-molecule that is trapped in the sensing trench 130) has a gating effect on the base of the sensing BJT 120 (i.e., the lower epitaxial intrinsic base 123 and the upper epitaxial intrinsic base 124 of FIG. 1) in that the analyte changes a surface potential of the base at a base/dielectric interface. This in turn changes the base current and therefore the collector and emitter currents of the sensing BJT 120. The sensing BJT 120 thus has an intrinsic gain associated with a BJT current gain ($\beta_1$), which is further amplified by the current gain of the amplifying BJT 110 ($\beta_2$) and thereby creating a very high effective gain of approximately $\beta_1 * \beta_2$.

With reference to FIG. 3, the biosensor device 101 can be provided in an alternative configuration in which the amplifying BJT 110 is arranged as an NPN transistor and the sensing BJT 120 is arranged as a PNP transistor. In this case, the sensing BJT 120 and the amplifying BJT 110 are electrically coupled to form a Sziklai pair 140' characterized in that the collector 122 of the sensing BJT 120 is connected to the base 112 of the amplifying BJT 110, the emitter 113 of the amplifying BJT serves as a collector for the Sziklai pair 140' and the emitter 121 of the sensing BJT 120 is connected to the collector 111 of the amplifying BJT 110 to serve as an emitter for the Sziklai pair 140'. The biosensor device 101 of FIG. 3 is generally similar to the biosensor device 101 of FIG. 1 and its description need not be repeated.

With reference to FIG. 4 and in accordance with further embodiments, the sensing trench 130 of the biosensor device 101 of FIG. 1 or the biosensor device 101 of FIG. 3 can be bifurcated one or more times (i.e., into first sensing trench 1301 and into second sensing trench 1302, although additional bifurcations can be made). In these or other cases, multiple analytes of similar or different composition can be trapped in the first sensing trench 1301 and the second sensing trench 1302.

Figure 5:
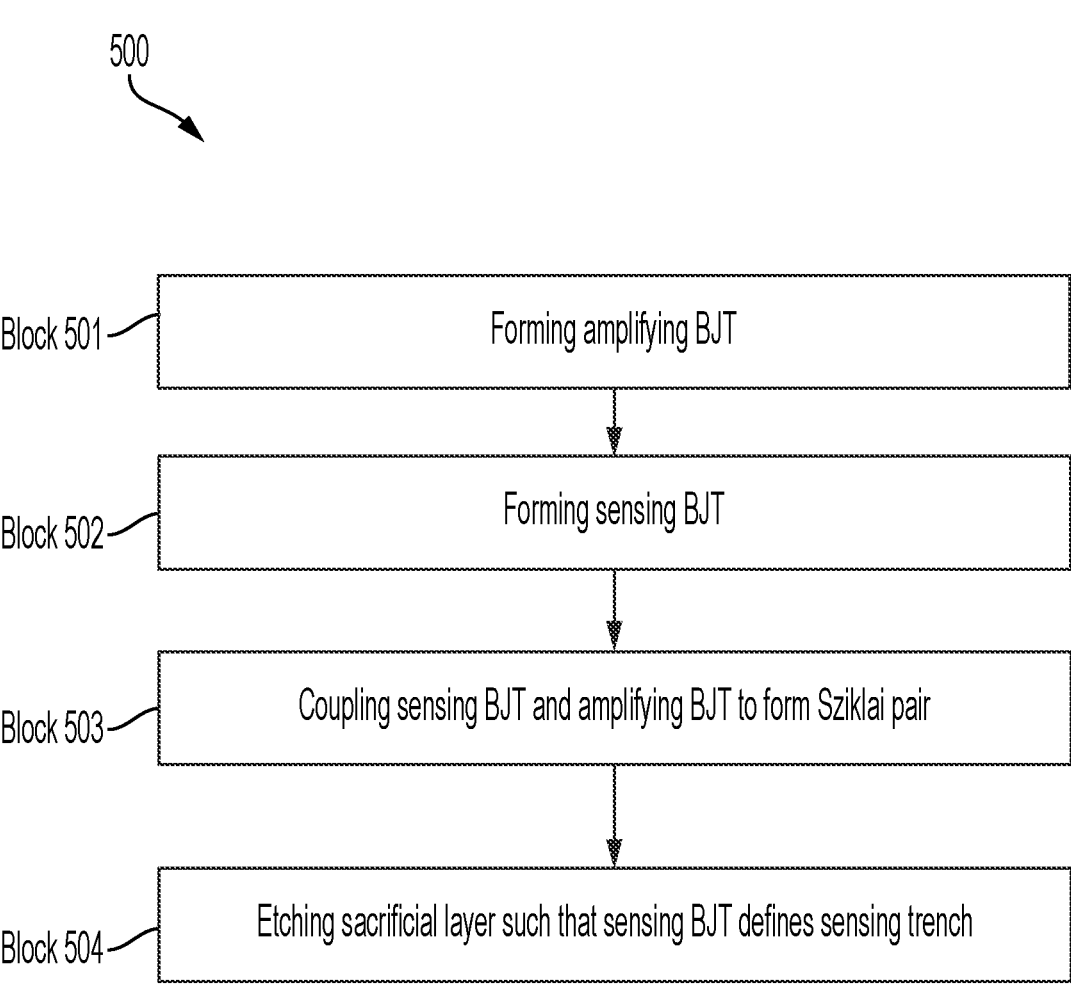
FIG. 5 is a flow diagram of a method of assembling a biosensor device in accordance with one or more embodiments of the present invention.

With reference to FIG. 5, a method 500 of assembling a biosensor device, such as the biosensor device 101 of FIG. 1 and the biosensor device 101 of FIG. 3, is provided. As shown in FIG. 5, the method 500 includes forming an amplifying bipolar junction transistor (BJT) as a lateral transistor (block 501), forming a sensing BJT, which comprises a sacrificial layer interposed between lower and upper intrinsic bases, as a vertical transistor on the amplifying BJT (block 502), coupling the sensing BJT and the amplifying BJT to form one of a Sziklai pair with an NPN-PNP arrangement and a Sziklai pair with a PNP-NPN arrangement (block 503) and etching the sacrificial layer such that the sensing BJT defines a sensing trench (block 504).

With continued reference to FIG. 5 and with additional reference to FIGS. 6-9 and additional reference back to FIG. 1, the method 500 of FIG. 5 includes several discrete operations.

Figure 6:
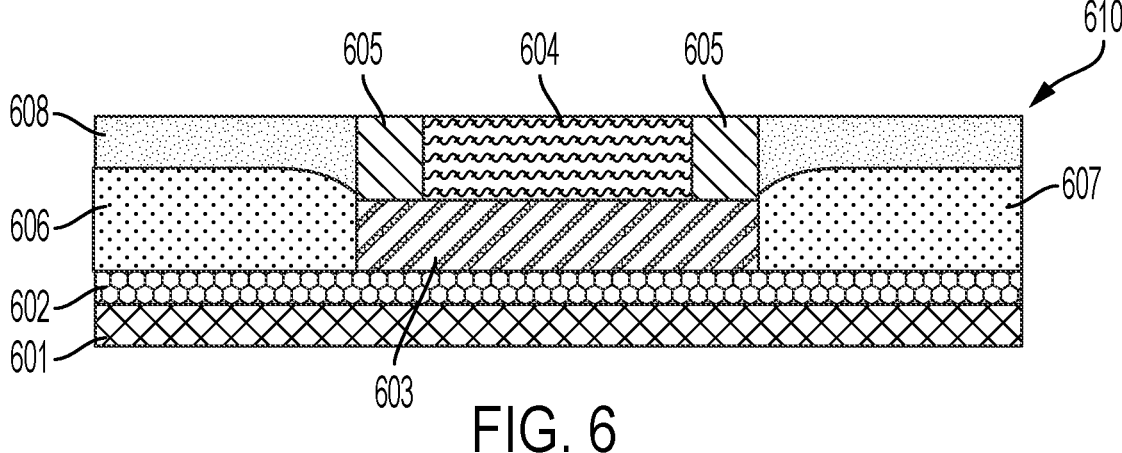
FIG. 6 is an initial structure formed during an execution of the method of FIG. 5 in accordance with one or more embodiments of the present invention.

As shown in FIG. 6, the forming of the amplifying BJT as the lateral transistor of block 501 of FIG. 5 initially includes laying down a semiconductor substrate 601, disposing a buried oxide (BOX) or insulator layer 602 on the semiconductor substrate 601, disposing a p-type SiGe layer 603 on the insulator layer 602 (in the case of the amplifying BJT being an NPN transistor) and forming a p+ extrinsic layer 604 of epitaxial material by epitaxy on the p-type SiGe layer 603. Subsequently, a hardmask is formed, the extrinsic layer 604 is patterned and spacers 605 are formed aside the extrinsic layer 604. This is followed by a vertical recession of opposite ends of the p-type SiGe layer 603 and an optional angled p-type implantation for association with the emitter along with an optional angled n-type implantation for association with the collector side. At this point, emitter/collector growth occurs by epitaxial growth to form an n+ Si emitter 606 and an n+ Si collector 607 whereupon interlayer dielectric (ILD) 608 is formed and recessed by chemical mechanical polishing (CMP) to expose the extrinsic layer 604. This completes the formation of the amplifying BJT 610 as the lateral transistor.

Figure 7:
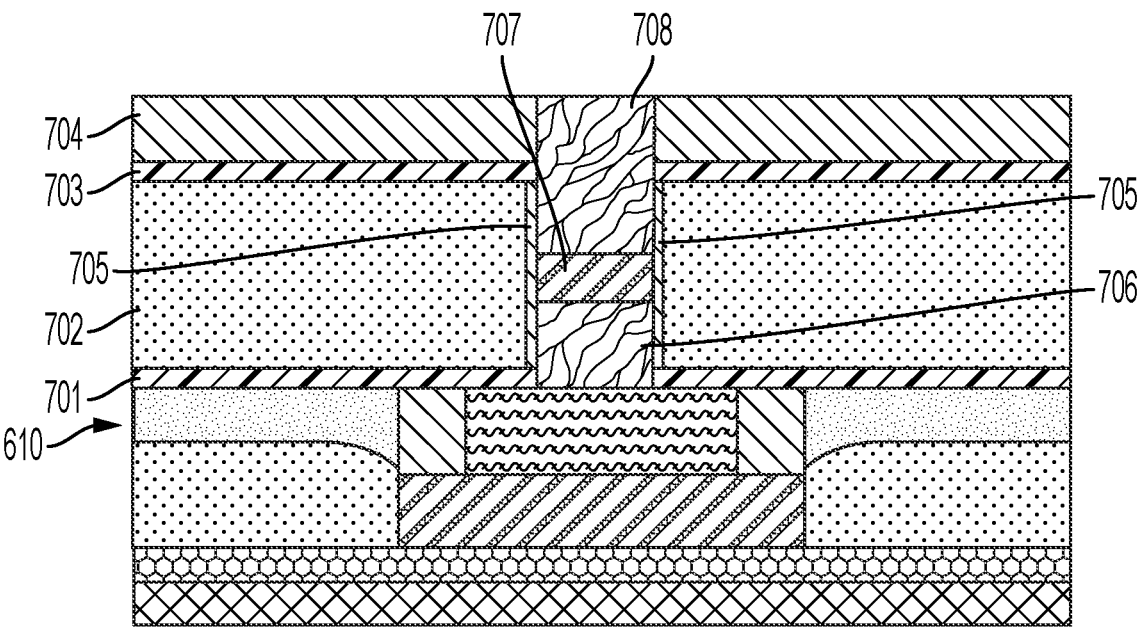
FIG. 7 is a first intermediate structure formed during an execution of the method of FIG. 5 in accordance with one or more embodiments of the present invention.

As shown in FIG. 7, the forming of the sensing BJT as the vertical transistor on the amplifying BJT of block 502 of FIG. 5, initially includes forming a blanket bottom spacer 701 (e.g., by pad nitride deposition) on the amplifying BJT 610 of FIG. 6, forming sacrificial material 702 (i.e., amorphous silicon) on the bottom spacer 701, forming a top spacer 703 of nitride on the sacrificial material 702 and forming oxide 704 on the top spacer 703. Subsequently, an opening is formed by an etch through the oxide 704, the top spacer 703 and the sacrificial material 702 to the bottom spacer 701, exposed surfaces of the sacrificial material 702 are oxidized to form thin oxide layers 705 and the bottom spacer 701 is opened by a process selective to the extrinsic layer 604 of FIG. 6. At this point, within the opening, a lower base 706 of the sensing BJT is formed by epitaxy (silicon or 20% SiGe) in contact with the extrinsic layer 604 of FIG. 6, a sacrificial sensing gap layer 707 is formed by epitaxy (50-60% SiGe) and an upper base 708 is formed by epitaxy (silicon or 20% SiGe). The top of the upper base 708 is then polished to the oxide 704.

Figure 8:
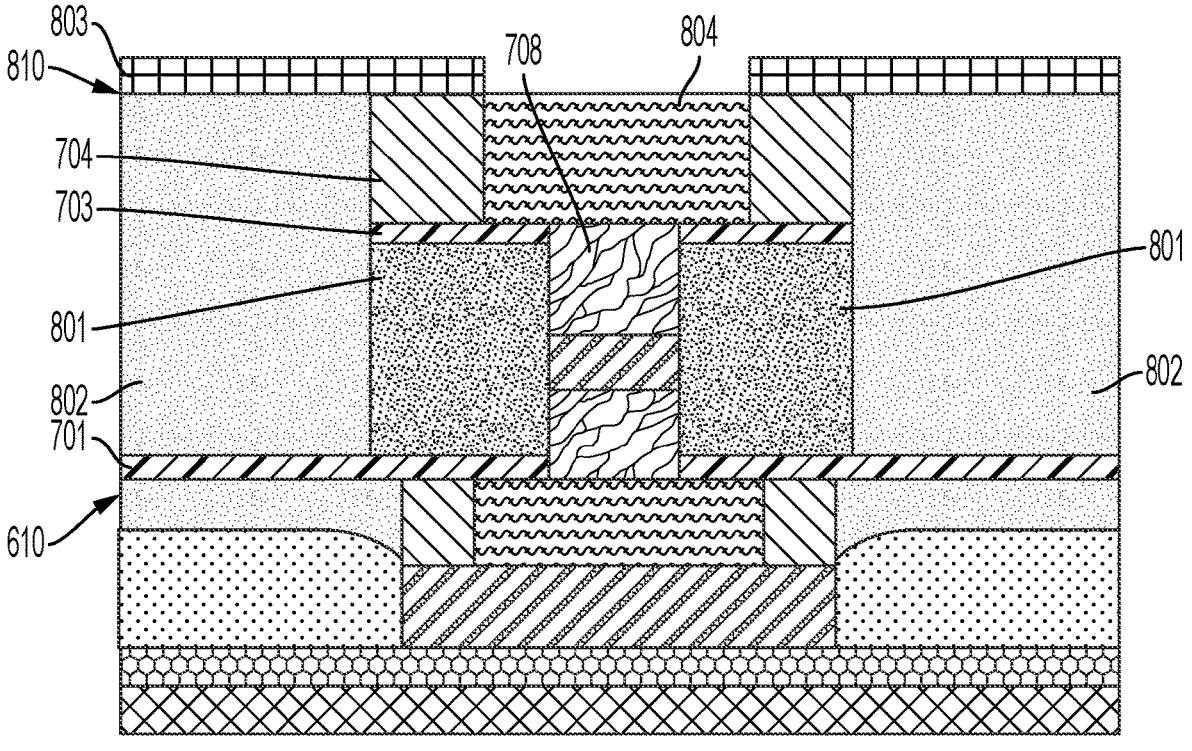
FIG. 8 is a second intermediate structure formed during an execution of the method of FIG. 5 in accordance with one or more embodiments of the present invention.

As shown in FIG. 8, the forming of the sensing BJT as the vertical transistor on the amplifying BJT of block 502 of FIG. 5, further includes additional oxide being deposited and planarized by CMP and a hard mask being provided to mask at least the base region. Next, reactive ion etching (RIE) is performed on exposed oxide, the oxide 704, the top spacer 703 and partially on the sacrificial material 702 until the RIE approaches the bottom spacer 701. The sacrificial material 702 is then removed followed by the oxide layers 705 being removed (e.g., by a short HF etch or pre-epitaxial growth SiCoNi). At this point, base material 801 is grown by epitaxy and recessed using the hard mask and ILD 802 is deposited outside the base material 801. The hard mask is then removed, the ILD 802 is planarized by CMP and an emitter mask 803 is positioned. This is followed by exposed portions of the oxide 704 and uppermost portions of the upper base 708 being recessed through the emitter mask 803 and a p+ emitter 804 being formed by epitaxy. This completes the formation of the sensing BJT 810 as the vertical transistor.

Figure 9:
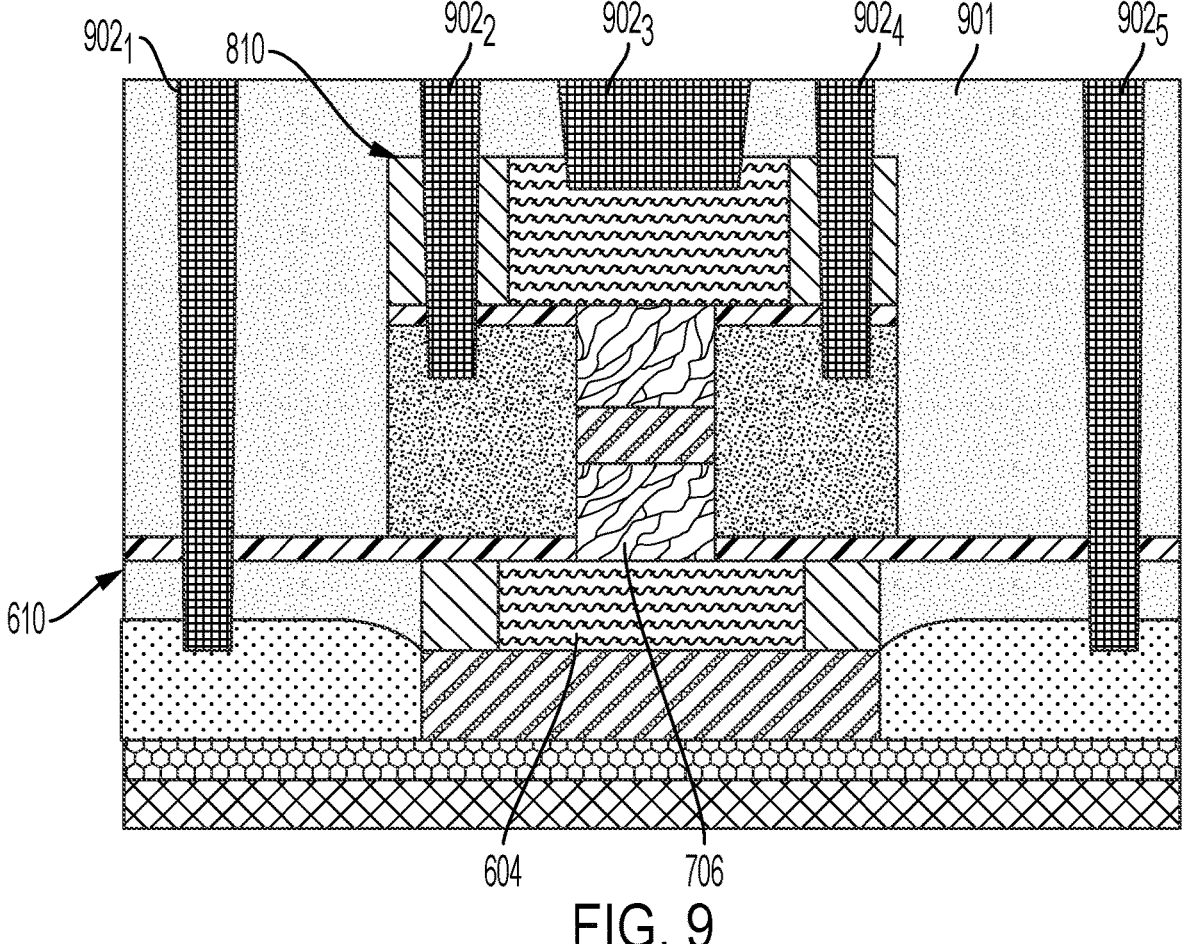
FIG. 9 is a third intermediate structure formed during an execution of the method of FIG. 5 in accordance with one or more embodiments of the present invention.

As shown in FIG. 9 and in FIG. 1, the coupling of the sensing BJT and the amplifying BJT to form one a Sziklai pair of block 503 of FIG. 5 initially includes removal of the emitter mask 803, an optional CMP, ILD 901 fill and CMP and subsequent formation of contacts $902_1$, $902_2$, $902_3$, $902_4$ and $902_5$. The Sziklai pair is characterized in that the contact $902_3$ of the emitter of the sensing BJT is connected to contact $902_5$ of the collector of the amplifying BJT forming an emitter of the Sziklai pair and the collector of the sensing BJT is connected to the base of the amplifying BJT (i.e., the extrinsic layer 604 of FIG. 6) forming a collector of the Sziklai pair.

As shown in FIG. 1, the etching of the sacrificial layer such that the sensing BJT defines the sensing trench of block 504 includes a lateral etch of the sacrificial sensing gap layer 707 of FIG. 7 to reveal the sensing trench 130 and a subsequent formation of the dielectric layer 131 to functionalize the sensing trench 130.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A biosensor device, comprising:
an amplifying bipolar junction transistor (BJT); and
a sensing BJT defining a sensing trench,
the sensing BJT and the amplifying BJT being coupled to form a Sziklai pair with an emitter of the sensing BJT connected to a collector of the amplifying BJT and a collector of the sensing BJT connected to a base of the amplifying BJT.

2. The biosensor device according to claim 1, wherein the sensing BJT is a PNP transistor and the amplifying BJT is an NPN transistor.

3. The biosensor device according to claim 1, wherein the sensing BJT is a vertical transistor, the amplifying BJT is a lateral transistor and the sensing BJT is integrated vertically on the amplifying BJT.

4. The biosensor device according to claim 3, wherein:
the lateral transistor comprises an emitter, the collector of the amplifying BJT, an epitaxial intrinsic base interposed between the emitter and the collector of the amplifying BJT and an epitaxial extrinsic base disposed as the base of the amplifying BJT on the epitaxial intrinsic base,
the vertical transistor comprises a lower epitaxial intrinsic base disposed on the epitaxial extrinsic base and an upper epitaxial intrinsic base with the sensing trench defined between the lower and upper epitaxial intrinsic bases, and
the vertical transistor further comprises extrinsic bases in contact with opposite ends of the lower and upper epitaxial intrinsic bases and the sensing trench.

5. The biosensor device according to claim 1, further comprising a dielectric layer lining the sensing trench.

6. The biosensor device according to claim 1, wherein dimensions of the sensing trench are set according to a size of a biomolecule being sensed.

7. The biosensor device according to claim 1, wherein a height of the sensing trench is selected from the group comprising about 0.3 nm for DNA sensing, about 5-10 nm for small protein sensing, about 40 nm for enzyme or exosome sensing, about 100 nm for large protein sensing and about 5000 nm for cancer cell sensing.

8. The biosensor device according to claim 1, wherein the sensing trench is bifurcated one or more times.

9. A biosensor device, comprising:
an amplifying bipolar junction transistor (BJT) arranged as a NPN transistor; and
a sensing BJT defining a sensing trench and being arranged as a PNP transistor,
the sensing BJT and the amplifying BJT being coupled to form a Sziklai pair characterized in that an emitter of the sensing BJT is connected to a collector of the amplifying BJT to serve as an emitter for the Sziklai pair, a collector of the sensing BJT is connected to a base of the amplifying BJT and an emitter of the amplifying BJT serves as a collector for the Sziklai pair.

10. The biosensor device according to claim 9, wherein the sensing BJT is a vertical transistor, the amplifying BJT is a lateral transistor and the sensing BJT is integrated vertically on the amplifying BJT.

11. The biosensor device according to claim 9, further comprising a dielectric layer lining the sensing trench.

12. The biosensor device according to claim 9, wherein dimensions of the sensing trench are set according to a size of a biomolecule being sensed.

13. The biosensor device according to claim 9, wherein a height of the sensing trench is selected from the group comprising about 0.3 nm for DNA sensing, about 5-10 nm for small protein sensing, about 40 nm for enzyme or exosome sensing, about 100 nm for large protein sensing and about 5000 nm for cancer cell sensing.

14. The biosensor device according to claim 9, wherein the sensing trench is bifurcated one or more times.

15. A biosensor device, comprising:
an amplifying bipolar junction transistor (BJT) arranged as an PNP transistor; and
a sensing BJT defining a sensing trench and being arranged as a NPN transistor,
the sensing BJT and the amplifying BJT being coupled to form a Sziklai pair characterized in that a collector of the sensing BJT is connected to a base of the amplifying BJT, an emitter of the amplifying BJT serves as a collector for the Sziklai pair and an emitter of the sensing BJT is connected to a collector of the amplifying BJT to serve as an emitter for the Sziklai pair.

16. The biosensor device according to claim 15, wherein the sensing BJT is a vertical transistor, the amplifying BJT is a lateral transistor and the sensing BJT is integrated vertically on the amplifying BJT.

17. The biosensor device according to claim 15, further comprising a dielectric layer lining the sensing trench.

18. The biosensor device according to claim 15, wherein dimensions of the sensing trench are set according to a size of a biomolecule being sensed.

19. The biosensor device according to claim 15, wherein a height of the sensing trench is selected from the group comprising about 0.3 nm for DNA sensing, about 5-10 nm for small protein sensing, about 40 nm for enzyme or exosome sensing, about 100 nm for large protein sensing and about 5000 nm for cancer cell sensing.

20. The biosensor device according to claim 15, wherein the sensing trench is bifurcated one or more times.

21. A method of assembling a biosensor device, the method comprising:
forming an amplifying bipolar junction transistor (BJT) as a lateral transistor;

forming a sensing BJT, which comprises a sacrificial layer interposed between lower and upper intrinsic bases, as a vertical transistor on the amplifying BJT;

coupling the sensing BJT and the amplifying BJT to form a Sziklai pair; and etching the sacrificial layer such that the sensing BJT defines a sensing trench.

22. A method of assembling a biosensor device, the method comprising:

forming an amplifying bipolar junction transistor (BJT) as a lateral transistor;

forming a sensing BJT, which comprises a sacrificial layer interposed between lower and upper intrinsic bases, as a vertical transistor on the amplifying BJT;

coupling the sensing BJT and the amplifying BJT to form one of a Sziklai pair with an NPN-PNP arrangement and a Sziklai pair with a PNP-NPN arrangement; and etching the sacrificial layer such that the sensing BJT defines a sensing trench.

\* \* \* \* \*